US006064189A

United States Patent [19]

Frankel

[11] Patent Number: 6,064,189

[45] Date of Patent: May 16, 2000

[54] ROOF RIB FINDER AND FASTENING DEVICE USING AN INDUCTIVE SWITCH

[75] Inventor: Samuel R. Frankel, Reading, Pa.

[73] Assignee: Construction Fasteners, Inc., Wyomissing, Pa.

[21] Appl. No.: 09/034,666

[22] Filed: Mar. 4, 1998

[51] Int. Cl.[7] .......... G01R 19/00

[52] U.S. Cl. .......... 324/67; 324/207.16; 324/207.26; 324/260; 324/262

[58] Field of Search .......... 324/67, 228–231, 324/239, 207.11, 207.13–207.17, 207.26, 260, 262

[56] References Cited

U.S. PATENT DOCUMENTS 4,310,797 1/1982 Butler .......... 324/228
5,562,240 10/1996 Campbell .......... 227/130

*Primary Examiner*—Jay Patidar
*Attorney, Agent, or Firm*—Caesar, Rivise, Bernstein, Cohen & Pokotilow, Ltd.

[57] ABSTRACT

A roof rib finder and fastening device using an inductive switch whereby ribs in a roofing structure can be located and a signal given to an operator to lower and actuate a screw loading device to enable the installation of a screw through an opening in a washer to achieve securement of the screw-washer combination to a rib in a roofing structure; the device includes a support frame, a screw loading device, a washer retaining device and an inductive proximity switch including an adjustable sensing distance potentiometer secured to a support frame as well as a light to indicate to the installer that the proper position on the roofing structure immediately above a rib has been located.

6 Claims, 2 Drawing Sheets

ROOF RIB FINDER AND FASTENING DEVICE USING AN INDUCTIVE SWITCH

BACKGROUND OF THE INVENTION

The present invention relates to a mobile rib finder which is used to aid in fastening roofing materials to ribbed roof metal deck structures. The device can be used in the installation of screw and plate assemblies in roofs. The device enables the installer to locate the proper position to fasten the screw/plate assembly in the roofing material to secure the roofing material to a lower roof deck structure which is undulating in nature. In the past, it has been difficult to properly and consistently locate the proper alignment of the screw with the uppermost portion of the lower roof deck structure, since that structure is hidden by the presence of an upper layer of roofing material. The present invention thus overcomes this problem and enables the reliable placement of screw/plate assemblies in the desired position.

BRIEF SUMMARY OF THE INVENTION

The present invention relates to a mobile rib finder which is used to aid in fastening roofing materials to ribbed roof metal deck structures. The device can be used in the installation of screw and plate assemblies in roofs. The device enables the installer to locate the proper position to fasten the screw/plate assembly in the roofing material to secure the roofing material to a lower roof deck structure which is undulating in nature. In the past, it has been difficult to properly and consistently locate the proper alignment of the screw with the uppermost portion of the lower roof deck structure, since that structure is hidden by the presence of an upper layer of roofing material.

The device includes a support frame, wheels and a screw and washer retaining device. An inductive proximity switch includes an adjustable sensing distance potentiometer to allow the operator to vary the range of the switch for different thicknesses of roofing materials. When the inductive proximity switch is over the top of a rib of a roof deck, a light will be actuated and the operator can then insert a screw and washer into the roof with confidence that it will secure the upper roofing material to the lower roof deck. The term "screw" as used herein includes a nail or other fastening device.

DETAILED DESCRIPTION OF THE INVENTION

Figure 1:
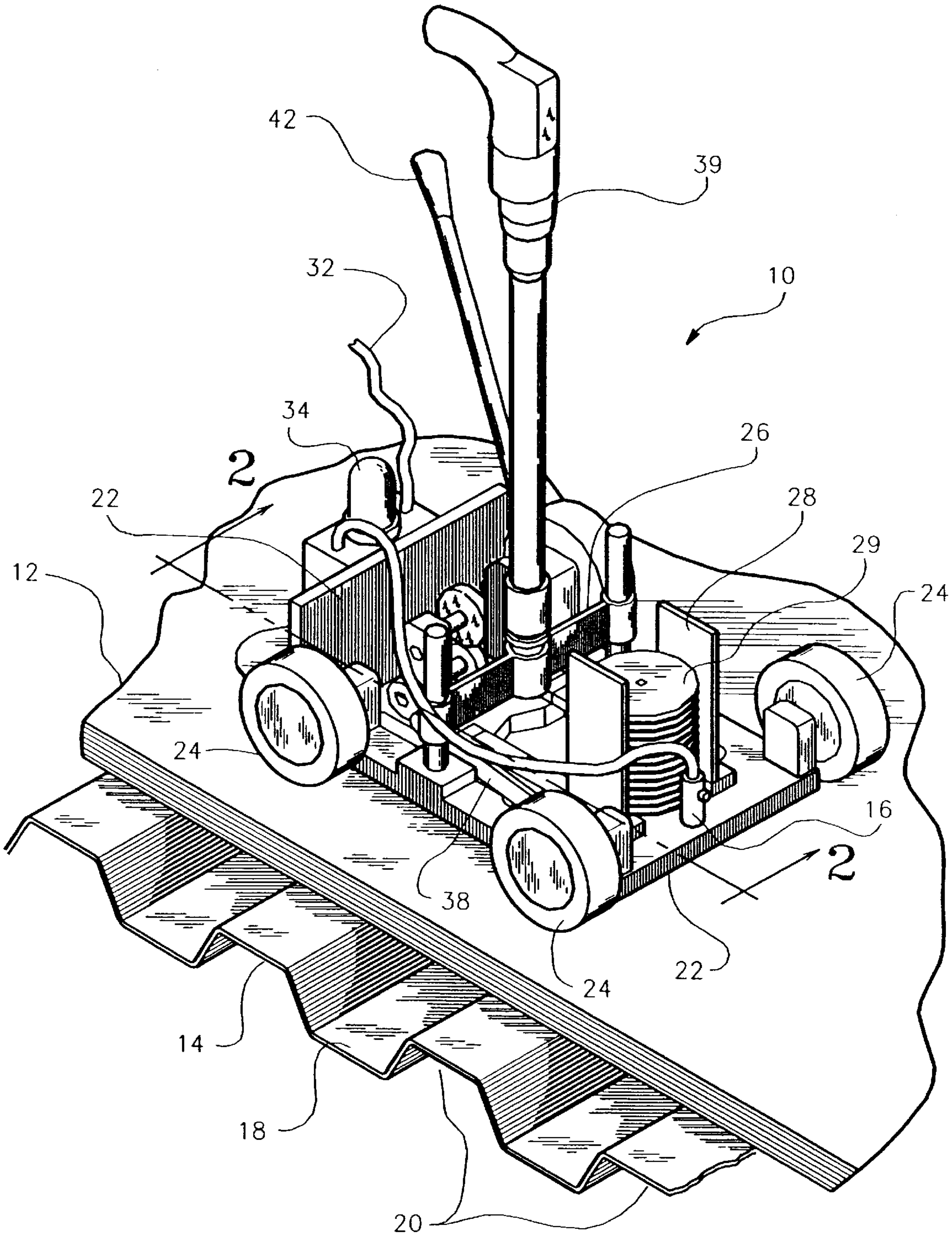
FIG. 1 is an isometric view of the mobile rib finder device of the present invention.
Figure 2A:
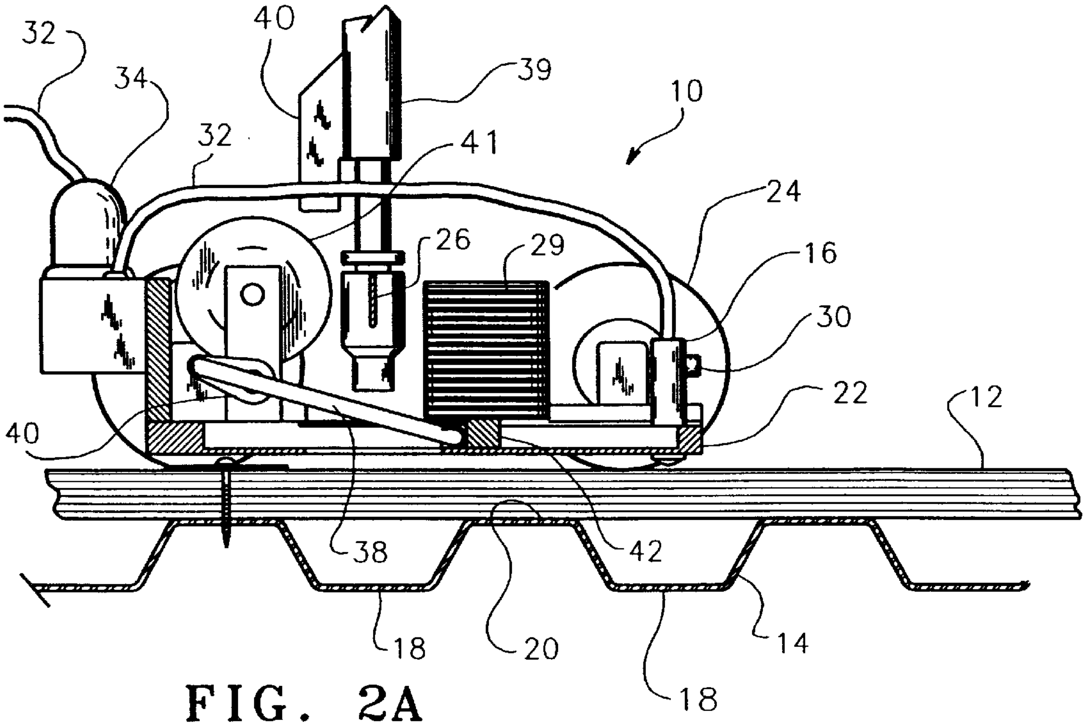
FIG. 2A is a side view of the device of FIG. 1, taken along line 2—2, showing the rib finder device of the present invention located in a position where the inductive proximity switch is over the bottom or well of a metal rib.
Figure 2B:
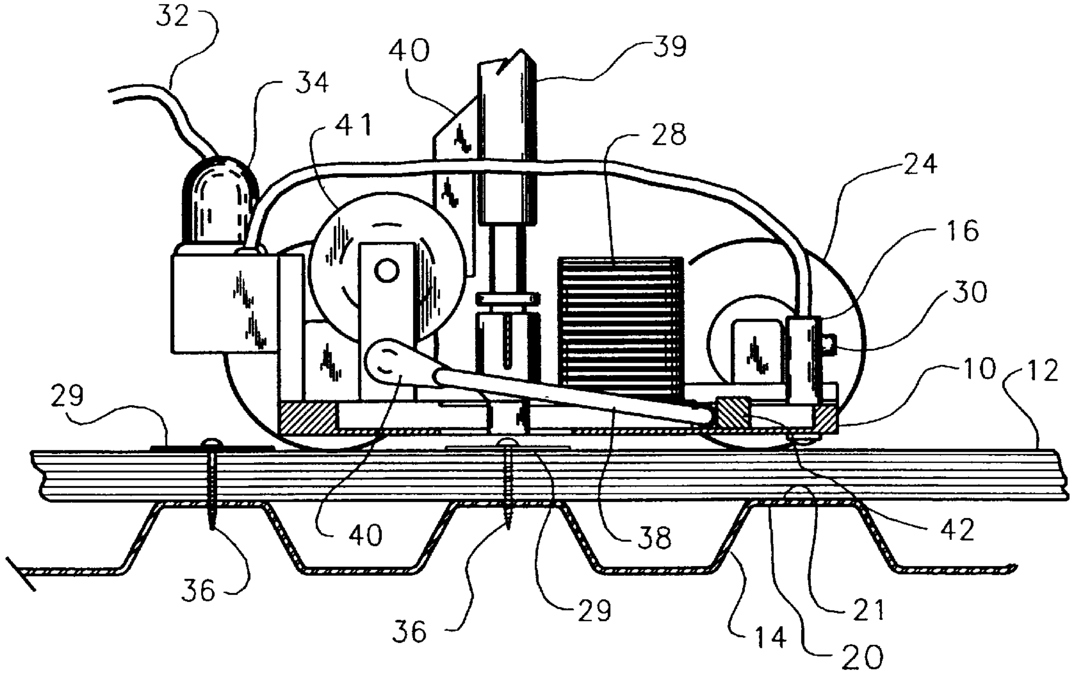
FIG. 2B is a side view of the device of FIG. 1, similar to FIG. 2A, but showing where the rib finder device of the present invention has been advanced such that the inductive proximity switch is now located over the top or crest of a metal rib.

Referring now to various figures of the drawings where like reference numerals refer to like parts, there is shown at in FIG. 1, a device 10 constructed in accordance with this invention. The mobile rib finder 10 is used to fasten roofing materials 12 to ribbed metal roof decking 14. FIG. 2A shows the rib finder 10 located in a position where the inductive proximity switch 16 is over a bottom 18 of the ribbed metal roof decking 14. In FIG. 2B, the inductive proximity switch 16 is over the top 21 of rib 20 of the metal roof decking 14.

The mobile rib finder 10 comprises a support frame 22, wheels 24, a screw loading device 26 and a washer retainer 28. The inductive proximity switch 16 is equipped with an adjustable sensing distance potentiometer 30 (FIGS. 2A and 2B) to allow the operator to vary the range of the switch for different thicknesses of roofing materials. The inductive proximity switch 16 and potentiometer 30 are conventional in nature and may be obtained from the Allen Bradley Company, 1201 S. Second, Milwaukee, Wis. as Model No. 871F-D70-NP50-D4.

Power for the inductive proximity switch is obtained through a conventional power source that is connected to the device by means of a conventional electric cord 32 which also supplies power to a conventional indicator light 34. When the inductive proximity switch 16 is over the top of a rib 20 as in FIG. 2B, the light 34 will be actuated as illustrated in FIG. 2B by the shading of the light bulb 34, to tell the operator that the device is now in such a position that the washer retainer device has permitted a washer 29 to be dropped down by the device 10 over the desired location of the roofing material 12.

The washer 29 to be placed on the roof 12 is automatically dropped into the desired location as the device 10 is rolled across the roof 12 as described below. As the device 10 is moved across the roof 12, as seen in FIGS. 1 and 2A and 2B, in the operative position as shown in FIG. 2B, as actuated when the proximity switch is moved by the operator so the active position of FIG. 2B, the movement of the arm 38 is intitiated to that it slides from the retracted position of FIG. 2A toward the rear of the device 10 (as shown in a comparison of FIG. 2A and FIG. 2B). This occurs by virtue of operation of the cam mechanism 40 as the operator lowers arm 39 (which contacts and moves cam mechanism 40) to the lower position of FIG. 2B. The forward portion of the arm 38 includes a washer feeder block 42. As the movement of the arm 38 occurs from the rear position toward the front of the device 10 (from left to right as can be seen by a comparison of FIGS. 2A and 2B), the washer feeder block 42 passes through an elongated channel (not shown) to catch the edge of the lowermost washer 29 placed in the washer retaining means 28. The washer feeder block 42 engages a wall in the central opening (not shown) of the washer. The height of the washer feeder block 42 which protrudes through the top portion of platform 22 is such as to only engage one washer at a time and the washer feeder block 42 has a taper (not shown) which allows it to return to the initial withdrawn position as shown in FIG. 2A. By the movement of the arm 38, the washer 29 slides across the upper surface of platform 22 to an aperture in the platform 22 and drops below the device 10 to the roof 12. The stack of washers then ensures another washer 29 is available to be dropped to the desired location as the device is then moved through another cycle.

After the washer is in the desired dropped location as described above, the mechanic then inserts a screw 36 into the screw loading device 26 as shown in FIG. 2B. The worker then rotates the screw 36 in a conventional fashion using an electric screw driver 40 to drive the screw 36 home through the roofing material 12 and rib 20. The mechanic may then move the device 10 to the next desired location for use by pushing upon handle 42 (FIG. 1) to enable the device to roll on wheels 24.

Without further elaboration the foregoing will so fully illustrate my invention that others may, by applying current or future knowledge, adapt the same for use under various conditions of service.

I claim:

1. A roof rib finder device for locating ribs in a roofing structure to enable the securement of screws to the roofing structure, the device comprising:

a. a support frame;

b. screw loading means adjacent the support frame for receiving a screw;

c. means for positioning a washer adjacent the support frame;

d. inductive proximity switch means including an adjustable sensing distance potentiometer secured to the support frame for locating an upper portion of the rib to which a screw to be secured; and e. means for indicating a rib top portion on the roofing structure where the screw is desired to be secured to the roofing structure.

2. The device of claim 1 wherein the support frame additionally comprises wheels to move the device.

3. The device of claim 1 additionally comprising a power source connected to the proximity switch.

4. The device of claim 3 further including a light indicating source connected to the power source to indicate when the proximity switch is located adjacent the rib.

5. The device of claim 1 wherein the means for positioning the washer includes a washer feeder block secured to an end of an arm.

6. The device of claim 5 wherein the washer feeder block is actuated by a cam mechanism.

* * * * *